US006256850B1

(12) United States Patent
Lauffer et al.

(10) Patent No.: US 6,256,850 B1
(45) Date of Patent: Jul. 10, 2001

(54) METHOD FOR PRODUCING A CIRCUIT BOARD WITH EMBEDDED DECOUPLING CAPACITANCE

(75) Inventors: John M. Lauffer, Waverly; Konstantinos Papathomas, Endicott, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/022,258

(22) Filed: Feb. 11, 1998

Related U.S. Application Data

(62) Division of application No. 08/662,164, filed on Jun. 12, 1996, now Pat. No. 5,796,587.

(51) Int. Cl.$^7$ .................................................. H01G 7/00
(52) U.S. Cl. .................. 29/25.42; 29/25.41; 174/50.54; 174/250; 174/255; 174/260; 439/68; 361/301.1; 361/301.2; 361/306.3; 361/313; 361/314; 361/315; 361/320; 361/328; 361/763; 361/766; 361/821
(58) Field of Search ............................... 29/25.41, 25.42; 439/68; 174/50.54, 250, 255, 260; 361/301.1, 301.2, 306.2, 306.3, 311, 313, 314, 315, 320, 321.4, 328, 760, 761, 763, 766, 807, 809, 821

(56) References Cited

U.S. PATENT DOCUMENTS

| | | | |
|---|---|---|---|
| 3,635,759 | * | 1/1972 | Howatt .................................. 117/212 |
| 4,035,768 | * | 7/1977 | Boldridge, Jr. et al. ..... 340/146.3 SY |
| 4,241,378 | * | 12/1980 | Dorrian ................................. 361/305 |
| 4,775,573 | | 10/1988 | Turek .................................... 428/209 |
| 4,835,656 | * | 5/1989 | Kitahara et al. ...................... 361/321 |
| 4,864,465 | * | 9/1989 | Robibins ............................... 361/321 |
| 4,868,711 | * | 9/1989 | Hirama et al. ........................ 361/321 |
| 5,010,641 | * | 4/1991 | Sisler ..................................... 29/830 |
| 5,027,253 | * | 6/1991 | Lauffer et al. ........................ 361/313 |
| 5,072,329 | * | 12/1991 | Galvagni ............................... 361/321 |
| 5,079,069 | | 1/1992 | Howard et al. ....................... 428/209 |
| 5,155,655 | | 10/1992 | Howard et al. ....................... 361/303 |
| 5,161,086 | | 11/1992 | Howard et al. ....................... 361/321 |
| 5,162,977 | | 11/1992 | Paurus et al. ......................... 361/401 |
| 5,172,304 | | 12/1992 | Ozawa et al. ......................... 361/401 |
| 5,206,788 | * | 4/1993 | Larson et al. ......................... 361/313 |
| 5,261,153 | | 11/1993 | Lucas .................................... 29/830 |
| 5,428,499 | | 6/1995 | Szerlip et al. ......................... 361/328 |
| 5,469,324 | | 11/1995 | Henderson et al. ............... 361/301.2 |
| 5,640,761 | * | 6/1997 | DiStefano et al. ..................... 29/830 |
| 5,800,575 | * | 8/1998 | Lucas .................................. 29/25.42 |

FOREIGN PATENT DOCUMENTS

| | | |
|---|---|---|
| 3-283592 | 12/1991 | (JP) . |
| 94/02310 | 2/1994 | (WO) . |

OTHER PUBLICATIONS

"Raw Card Composite Capacitor," Olsen, F. W., *IBM Technical Disclosure Bulletin*, vol. 22, No. 6, Nov. 1979, p. 2261.
"Integrated Power Plane Decoupling," *IBM Technical Disclosure Bulletin*, vol. 32, No. 4B, Sep. 1989, pp. 414–416.
"Noise Reduction Through Decoupling Techniques in Multi-Layered Printed Circuits," Fitzgerald, F. C., Research Disclosure No. 288, Apr. 1988, Article 28844.

* cited by examiner

*Primary Examiner*—Lee Young
*Assistant Examiner*—Rick Kiltae Chang
(74) *Attorney, Agent, or Firm*—William N. Hogg

(57) ABSTRACT

A method is provided for producing a capacitor to be embedded in an electronic circuit package comprising the steps of selecting a first conductor foil, selecting a dielectric material, coating the dielectric material on at least one side of the first conductor foil, and layering the coated foil with a second conductor foil on top of the coating of dielectric material. Also claimed is an electronic circuit package incorporating at least one embedded capacitor manufactured in accordance with the present invention.

12 Claims, 2 Drawing Sheets

METHOD FOR PRODUCING A CIRCUIT BOARD WITH EMBEDDED DECOUPLING CAPACITANCE

This application is a Divisional of Ser. No. 08/662,164 filed Jun. 12, 1996 now U.S. Pat. No. 5,796,587.

TECHNICAL FIELD OF THE INVENTION

The present invention relates to a printed circuit board with embedded decoupling capacitance and method for producing same. More particularly, the invention relates to printed circuit boards having very high integrated decoupling capacitances which are created by multi-layering pre-drilled or pre-etched conductor foils that have been coated with a dielectric material. The pre-drilled or pre-etched conductor foils are in the form of either voltage or ground planes. After coating with a dielectric material, the foils are stacked up such that voltage and ground planes alternate. The alternating stack then is laminated together with other signal planes to form the desired multi-layer circuit board.

BACKGROUND OF THE INVENTION

Electronic circuits contain many (sometimes millions) of components such as resistors, capacitors, inductors, diodes, electro-mechanical switches, and transistors. High density packaging of electronic components is particularly important to allow fast access to large amounts of data in computers. High density electronic circuit packages also are important in high frequency devices and communications devices. The components are connected to form circuits and circuits are connected to form functioning devices. The connections perform power and signal distribution. In a multi-layer electronic circuit package, some layers of the package serve as power planes and other layers serve as signal planes, depending on the operational requirements of the device. The devices require mechanical support and structural protection. The circuits themselves require electrical energy to function. The functioning devices, however, produce heat, or thermal energy which must be dissipated so that the devices do not stop functioning. Moreover, while high density packaging of a number of components can improve performance of the device, the heat produced by the power-consuming components can be such that performance and reliability of the devices is adversely impacted. The adverse impact arises from electrical problems such as increased resistivity and mechanical problems such as thermal stress caused by increased heat.

High density packages necessarily involve increased wiring density and thinner dielectric coatings between layers in a multi-layer electronic circuit package. The layers in a multi-layer package are electrically connected by vias and through-holes. The term "via" is used for a conductive pathway between adjacent layers in a multi-layer electronic circuit package. The term "through-hole" is used for a conductive pathway that extends to a non-adjacent layer. For high density packages the through-holes are increasingly narrow in diameter and the through-holes in each layer must be aligned precisely.

Electronic circuit packages, such as chips, modules, circuit cards, circuit boards, and combinations of these, thus must meet a number of requirements for optimum performance. The package must be structurally sturdy enough to support and protect the components and the wiring. In addition, the package must be capable of dissipating heat and must have a coefficient of thermal expansion that is compatible with that of the components. Finally, to be commercially useful, the package should be inexpensive to produce and easy to manufacture.

Electronic circuit packages, while used in both digital and analog circuits, find their greatest application in digital circuits. In digital circuits a narrow band around one discrete value of voltage corresponds to a logical "0" and another narrow band around a second discrete value of voltage corresponds to a logical "1". Signals having these properties are "digital signals." Digital information processing depends upon the transmission, storage and application of these digital signals.

In digital information processing, a signal changes from one binary level to another. This change is ideally transmitted as a "step function." However, this ideal step function becomes distorted because of resistance, capacitance, inductance, and transmission line effects in the transmission line and in other transmission lines in the package. Moreover, this step function, whether ideal or distorted, gives rise to still other distortions and spurious signals, i.e., noise, and induced signals on other lines in the circuit package. Thus, it is necessary to filter noise out of digital circuits.

Filtering may be accomplished in digital circuit packages by providing internal RC filter circuits of appropriate RC time constant and band pass characteristics, and thereby capacitively coupling, or decoupling, signal lines with, for example, power lines, ground lines, or other signal lines.

Attempts at providing embedded decoupling capacitance are known in the art. For example, in U.S. Pat. No. 5,027,253 to Lauffer, et al, an integral buried capacitor is provided comprising a first electrode connected by a wire to a first signal core and a second electrode connected by a wire to a second signal core. The second electrode at least partially overlaps the first electrode but is separated from it by a thin film of dielectric material. The two electrodes and the thin film of dielectric material define the integral buried capacitor.

In U.S. Pat. No. 5,261,153, to Lucas ("Lucas"), a method is provided for forming a capacitor element internally within a printed circuit board. Lucas discloses arranging uncured dielectric sheets with conductive foils laminated to either side and incorporated as a layer in a printed circuit board.

The method of Lucas requires that clearance holes in the conductive foils be defined by etching through a patterned photoresist material on each foil individually. The present invention allows a multitude of foils to be stacked together and drilled or punched simultaneously, hence creating a lower cost package. Additionally, the Lucas method is subject to reliability problems of plane to plane shorting due to dendritic copper plating along the glass fibers of the thin dielectric material. The non-glass dielectric of the present invention does not contain any defined dendritic copper paths.

SUMMARY OF THE INVENTION

It is an object of this invention to provide a printed circuit board with decoupled ground and power busses to provide proper switching stimulus.

A further object of this invention is to provide printed circuit boards with very high decoupling capacitance values.

A third object of this invention is to provide methods of fabrication of printed circuit boards with integrated decoupling capacitance.

Accordingly, a method is provided for producing a capacitor to be embedded in an electronic circuit package comprising the steps of selecting a first conductor foil, selecting a dielectric material, coating the dielectric material on at least one side of the first conductor foil, and layering the coated foil with a second conductor foil on top of the coating of dielectric material. Also claimed is an electronic circuit package incorporating at least one embedded capacitor manufactured in accordance with the present invention.

It is an advantage of the present invention that the capacitor provided is embedded into the electronic circuit package, reducing or eliminating the need for surface-mount capacitors.

It is a further advantage that the embedded capacitors provided decouple the ground and power busses to provide proper switching stimulus.

It is a further advantage that using the embedded capacitors provided results in printed circuit boards with very high decoupling capacitance values.

Other features and advantages of the present invention will become apparent in the following detailed description of the preferred embodiment of the invention taken in conjunction with the accompanying drawings and examples.

DETAILED DESCRIPTION OF A PREFERRED EMBODIMENT OF THE INVENTION

Figure 1:
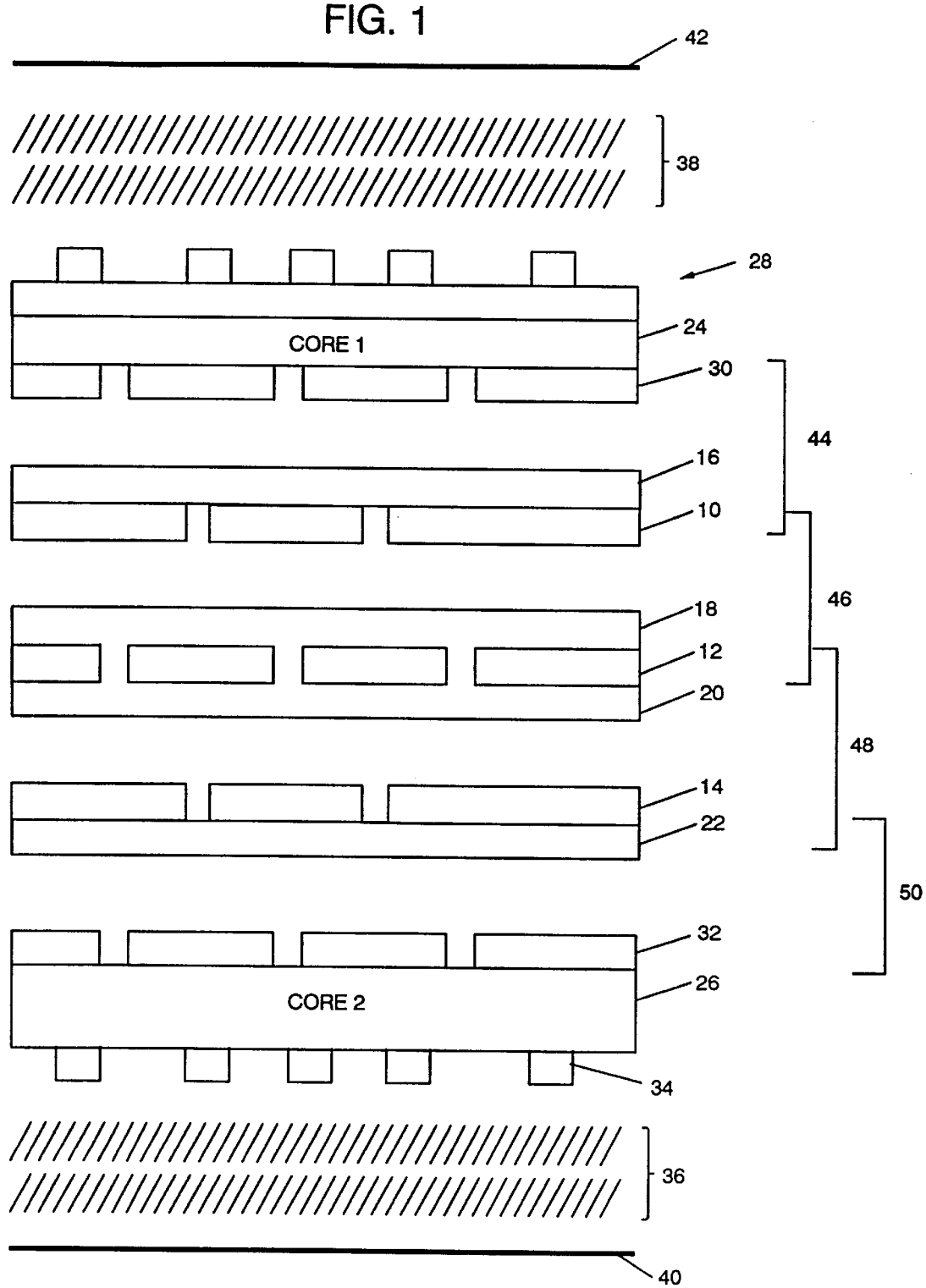
FIG. 1 is a depiction of a single layer of a multi-layer printed circuit board of the present invention.

The present invention is of a printed circuit board with embedded decoupling capacitance and a method for producing same. In this invention, printed circuit boards having very high integrated decoupling capacitances are created by the multi-layering within the printed circuit board of pre-drilled or pre-etched conductor foils that have been coated with a dielectric material. The pre-drilled or pre-etched conductor foils are in the form of voltage or ground planes. After coating with a dielectric material, they are stacked up in alternate fashion (i.e. voltage/ground/voltage) and laminated together with other signal planes to create the final multi-layer circuit board.

In the preferred embodiment of the invention, the conductor foil is of a copper material. Other suitable conductor foils include, but are not limited to, copper-Invar-copper, Invar, aluminum, and copper pre-laminated to a dielectric.

The dielectric coating may be any type of dielectric material from standard liquid epoxy, polyimide, Teflon, cyanate resins, powdered resin materials, or filled resin systems exhibiting enhanced dielectric constants. Coating of the dielectric material onto the conductor foil is performed with any number of methods known in the industry such as roller, draw, powder or curtain coating, electrostatic or electrophoretic deposition, screen printing, spraying, dipping or transfer of a dry film. Any of these coating methods is capable of providing uniformly thin (0.0001"–0.003") films. Once multi-layer laminated, the thickness of these coated films is not limited by a glass cloth material.

The following two examples further explain the invention. In the first example, an Advanced Solder Mask (ASM) dry film material was used to form a composite multi-layer printed circuit board with an integral capacitive stack-up in accordance with the present invention. Conventional signal-signal and signal-voltage cores were fabricated through means of lamination and circuitization. These circuitized cores were subjected to a copper oxide process to enhance composite lamination adhesion. In addition, copper foil/dielectric structures in accordance with the present invention were pre-fabricated as follows:

1. Three sheets of 1 oz. double treated copper foil were punched with tooling hole registration slots.
2. The three copper sheets were drilled. Two of the sheets, the top and bottom sheets of the stack-up, were stacked on a drill machine and drilled in a ground plane clearance hole pattern. The third sheet was drilled in a voltage plane clearance pattern for use in the center of the multi-layer printed circuit board.
3. A 0.002" thick ASM dry film with a Mylar carrier sheet was selected for the dielectric material. The dielectric material was hot roll laminated onto the top side of the top ground plane copper foil, the bottom side of the bottom ground plane copper foil, and both sides of the central voltage plane copper foil.
4. The Mylar carrier sheet was peeled from all of the ASM coatings, and the copper foil/ASM structures were placed in an oven at 150° C. for 30 minutes to remove the solvent from the ASM.
5. These copper foil/ASM structures were then stacked up over registration pins along with the pre-fabricated cores, glass cloth, and external copper foils, and the stack-up was subjected to a vacuum lamination process at 190° C., and 500 psi pressure to provide the final composite multi-layer board. The composite board was then processed through conventional drilling, plating, and external circuitization processes, providing a finished board with four (4) capacitive planes in parallel with each other.

The resultant ASM thickness of the finished board after drying and lamination was 0.001" per layer. The board had a dielectric constant of 3.5. The resultant board capacitance was 3.2 nano-Farads per square inch of board area.

FIG. 1 shows the printed circuit board constructed as described in Example 1. In FIG. 1, the three copper sheets that were drilled are labeled, 10, 12, and 14, respectively. Copper sheets 10 and 14 were drilled in a ground plane clearance hole pattern. Copper sheet 12 was drilled in a voltage plane clearance hole pattern. A sheet of ASM dry film 16 was then laminated to the top surface of copper sheet 10. ASM dry film sheets 18 and 20 were laminated on the top and bottom surfaces, respectively, of copper sheet 12. ASM dry film sheet 22 was laminated to the bottom surface of copper sheet 14. These copper sheet/ASM dry film structures then were treated as described above and stacked as shown in FIG. 1. FIG. 1 also shows the two circuitized cores 24 and 26, respectively. Circuitized core 24 has a signal plane 28 on the top surface and an etched copper foil sheet 30 on the bottom surfce. The copper foil sheet 30 is etched in a voltage pattern. Two layers of epoxy glass 36 and 38, and a copper foil sheet 40 and 42 enclose the top and bottom outer surfaces of the entire printed circuit board.

In FIG. 1, the four capacitive planes parallel with each other are labeled 44, 46, 48, and 50, respectively. Each capacitive plane has a dielectric material in between two conductive metal (copper) sheets.

In the second example, an 85% by weight $BaTiO_3$ particulate/multifunctional epoxy resin system was employed to fabricate a multi-layer composite circuit board structure with integral embedded capacitance. The printed circuit board was manufactured as follows:

1. Signal-voltage and signal-signal cores were fabricated through conventional lamination and subtractive etching techniques.
2. $BaTiO_3$ powder having a particulate size less than 5 microns was blended with a multifunctional epoxy resin at an 85% by weight mix. Methyl ethyl ketone ("MEK") solvent was added to the blend to aid in mixing and provide a proper coating viscosity.

3. The filled resin system was roller coated on the bottom (voltage) side of a first core, and on the top (voltage) side of a second core to a thickness of approximately 0.0015". After coating, the cores were dried in an oven at 140° C. for 5 minutes to remove any residual MEK.
4. A 1 oz. double treated copper foil sheet was drilled in a ground plane clearance hole pattern.
5. The two coated cores and the drilled copper foil were then arranged in a stack with other pre-fabricated cores and laminated at 188° C., 500 psi for 90 minutes to provide a multi-layer laminate with integral embedded capacitance planes.

The resultant structure, has two capacitance planes in parallel. The resultant structure has a thickness of 0.001", dielectric constant of 40, and a capacitance value of 18 nano-Farads per square inch of board area.

Figure 2:
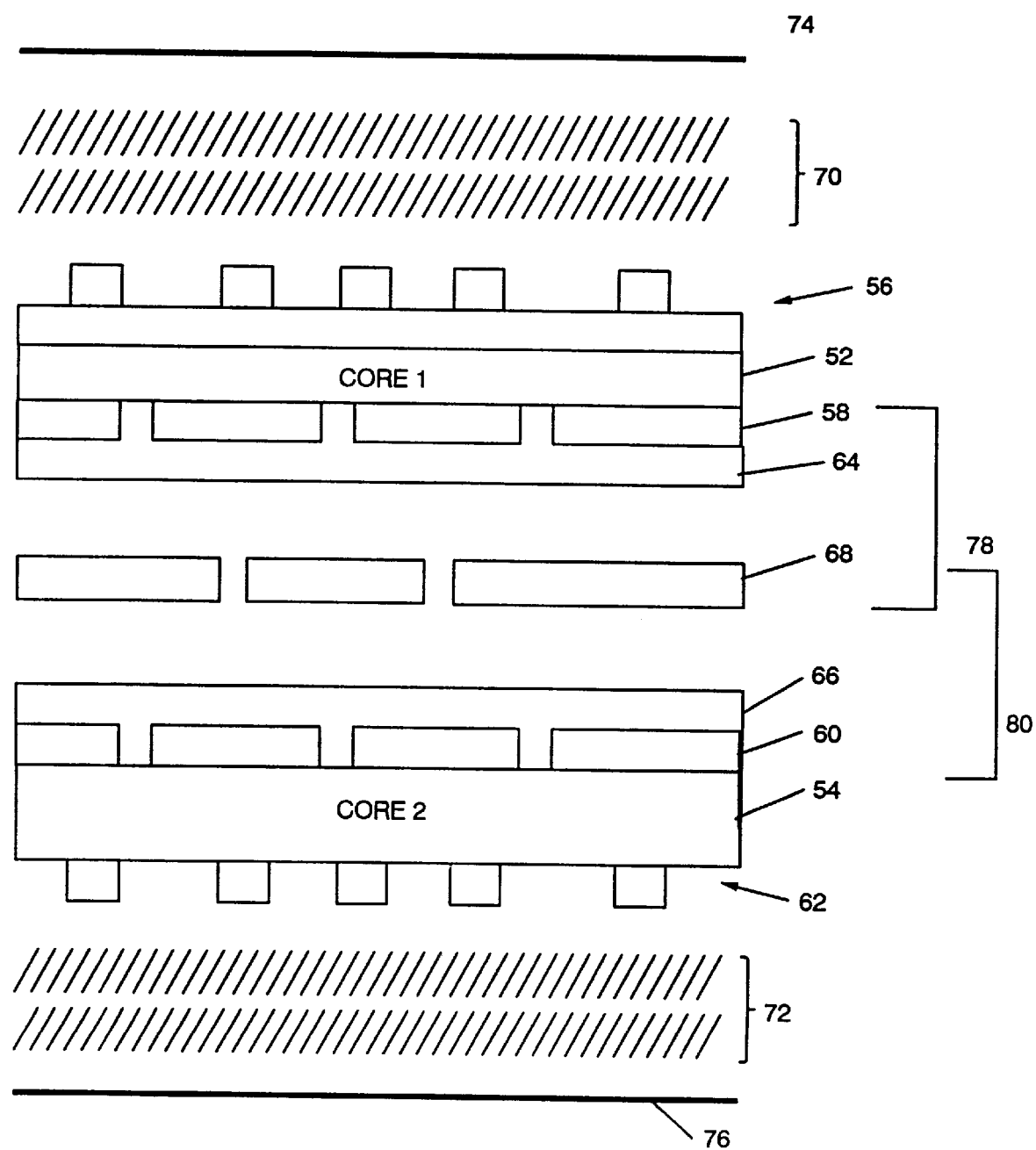
FIG. 2 is a depiction of a second alternative embodiment of a single layer of a multi-layer printed circuit board of the present invention.

FIG. 2 shows the printed circuit board constructed as described in Example 2. In FIG. 2, the two cores are numbered 52 and 54. Core 52 has signal plane 56 on the top surface and etched copper voltage plane 58 on the bottom surface. Core 54 has etched copper voltage plane 60 on the top, and signal plane 62 on the bottom. Both etched copper voltage planes 58 and 60 are coated with dielectric material to form layers 64 and 66, respectively. The dielectric material, as described above, is a filled resin system of $BaTiO_3$ powder, a multifunctional epoxy resin, and MEK solvent. The dielectric material was applied by roller coating. In between the dielectric material layers 64 and 66 is a double treated copper foil sheet 68 drilled in a ground plane clearance hole pattern. The outer surfaces of the printed circuit board are formed by two layers of epoxy glass 70, 72 and a copper foil sheet 74 and 76.

The printed circuit board in FIG. 2 has two capacitive planes 78, 80 in parallel with each other.

The previous examples are only two processes and resultant integrated capacitance structures that exemplify the usefulness of the present invention. It is obvious to one skilled in the art that there are many possible methods and variations to carry out the invention some of these include, but are not limited to the following:

1. In a high volume process, copper foils could be coated with the dielectric material in a roll to roll process. Likewise, clearance holes in the copper foils could be fabricated in a roll format, either before or after dielectric coating, by sequencing and gang punching of registration and clearance holes. Sheeting of the copper foil would be performed after coating and punching operations have been completed.
2. Instead of dielectric coating only one side of a copper foil, both sides of the foils to be laminated together could be coated with thin dielectric layers. This technique would minimize the possibility of dielectric pinholes, while not appreciably increasing the overall dielectric thickness.
3. Coated copper foils could be stacked in any number to achieve a desired capacitance value.
4. The coated foils can be stacked sequentially, or they could be staggered throughout a cross-section to create what is commonly referred to as a Tri-plate structure. Whether sequentially or staggered stacks, all planes would be capacitively coupled in parallel with plated through-holes in the finished structure.
5. The dielectric coating may include epoxy resins, polyimides, Teflons, cyanates, epoxy-acrylate solder masks, or the like, in either an unmodified or dielectric constant enhanced system.
6. Although copper is the preferred conductor material for printed circuit boards, any conductive material such as aluminum, Invar, or the like, and combinations thereof could be used.

Although specific embodiments and examples have been described herein for purposes of illustration, various modifications may be made without departing from the spirit or scope of the invention.

What is claimed is:

1. A method for producing a capacitor being embedded in a printed circuit board comprising the steps of:

selecting a first conductor foil and a second conductor foil;

forming clearance holes in the first conductor foil and the second conductor foil selecting a dielectric material composed of a particulate and a multi-functional epoxy matrix;

roller coating the dielectric material to a thickness of approximately 0.0015 inch on a first voltage side of the first conductor foil and on a second voltage side of the second conductor foil;

drying the coated first conductive foil and the coated second conductive foil in an oven at approximately 140° C. for approximately 5 minutes after coating;

drilling a treated third conductor foil in a ground plane clearance hole pattern;

stacking the coated first conductor foil and the coated second conductor foil with the drilled third conductor foil in a stack with other pre-fabricated cores; and thereafter laminating the stack.

2. The method of claim 1 wherein both sides of the first conductor foil are coated with the dielectric material.

3. The method of claim 1 wherein at least one side of the second conductor foil is coated with the dielectric material.

4. The method of claim 1 wherein the clearance holes in the first and second conductor foils are formed by drilling.

5. The method of claim 1 wherein the clearance holes in the first and second conductor foils are formed by etching.

6. The method of claim 1 wherein the clearance holes in the first and second conductor foils are punched.

7. A method for producing a capacitor being embedded in a printed circuit board comprising the steps of:

selecting a first conductor foil and a second conductor foil;

forming clearance holes in the first conductor foil and the second conductor foil;

selecting a dielectric material composed of a particulate and a multi-functional epoxy matrix;

roller coating the dielectric material on a first voltage side of the first conductor foil and on a second voltage side of the second conductor foil and drying said coated first and second conductive foils in an oven at approximately 140° C. for approximately 5 minutes;

drilling a treated third conductor foil in a ground plane clearance hole pattern;

stacking the coated first conductor foil and the coated second conductor foil with the drilled third conductor foil in a stack with other pre-fabricated cores; and laminating the stack.

8. The method of claim 7 wherein both sides of the first conductor foil are coated with the dielectric material.

9. The method of claim 7 wherein at least one side of the second conductor foil is coated with the dielectric material.

10. The method of claim 7 wherein the clearance holes in the first and second conductor foils are formed by drilling.

11. The method of claim 7 wherein the clearance holes in the first and second conductor foils are formed by etching.

12. The method of claim 7 wherein the clearance holes in the first and second conductor foils are punched.

* * * * *

UNITED STATES PATENT AND TRADEMARK OFFICE
CERTIFICATE OF CORRECTION

PATENT NO. : 6,256,850 B1  
DATED : July 10, 2001  
INVENTOR(S) : John M. Lauffer and Konstantinos Papathomas Page 1 of 1

It is certified that error appears in the above-identified patent and that said Letters Patent is hereby corrected as shown below:

Title page,  
Item [54], Title should read :  
   -- METHOD FOR PRODUCING A <u>PRINTED</u> CIRCUIT BOARD WITH EMBEDDED DECOUPLING CAPACITANCE --

Signed and Sealed this

Twenty-ninth Day of January, 2002

Attest:

JAMES E. ROGAN  
*Attesting Officer*     *Director of the United States Patent and Trademark Office*